United States Patent
Farnworth

(10) Patent No.: US 6,969,681 B2
(45) Date of Patent: *Nov. 29, 2005

(54) METHOD FOR FABRICATING A SEMICONDUCTOR COMPONENT USING CONTACT PRINTING

(75) Inventor: Warren M. Farnworth, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/002,031

(22) Filed: Dec. 1, 2004

(65) Prior Publication Data

US 2005/0106855 A1   May 19, 2005

Related U.S. Application Data

(63) Continuation of application No. 10/150,144, filed on May 17, 2002, now Pat. No. 6,897,089.

(51) Int. Cl.⁷ .......................... H01L 21/302
(52) U.S. Cl. .................. 438/689; 438/690; 216/45
(58) Field of Search .................. 438/689, 690, 438/597, 613, 618, 622; 216/44, 45

(56) References Cited

U.S. PATENT DOCUMENTS

| | | |
|---|---|---|
| 5,503,582 A | 4/1996 | Cathey, Jr. et al. |
| 5,597,613 A | 1/1997 | Galarneau et al. |
| 5,634,267 A | 6/1997 | Farnworth et al. |
| 5,658,575 A | 8/1997 | Ribier et al. |
| 5,735,985 A | 4/1998 | Ghosh et al. |
| 5,772,905 A * | 6/1998 | Chou .................. 216/44 |
| 5,909,706 A | 6/1999 | Jin et al. |
| 6,016,746 A | 1/2000 | Lake et al. |
| 6,019,037 A | 2/2000 | Larson |
| 6,034,427 A | 3/2000 | Lan et al. |
| 6,110,401 A | 8/2000 | Lee et al. |
| 6,190,929 B1 | 2/2001 | Wang et al. |
| 6,225,143 B1 | 5/2001 | Rao et al. |
| 6,249,050 B1 | 6/2001 | Wensel |
| 6,251,297 B1 * | 6/2001 | Komuro et al. ............ 216/24 |
| 6,259,036 B1 | 7/2001 | Farnworth |
| 6,285,203 B1 | 9/2001 | Akram et al. |
| 6,329,829 B1 | 12/2001 | Farnworth et al. |

(Continued)

OTHER PUBLICATIONS

H. Lorenz et al., "EPON SU-8: A Low-Cost Negative Resist for Mems", Suss Report, vol. 10, Third/Fourth Quarter 1996, pp. 1-3.

(Continued)

*Primary Examiner*—Tuan H. Nguyen
(74) *Attorney, Agent, or Firm*—Stephen A. Gratton

(57) ABSTRACT

A method for fabricating semiconductor components includes the steps of providing semiconductor dice on a substrate and forming a polymer layer on the substrate. In addition, the method includes the steps of providing a stencil having patterns thereon, and pressing the stencil into the polymer layer to form complimentary patterns in the polymer layer. The method also includes the steps of forming conductors in the polymer layer by forming a conductive layer on the complimentary patterns, and planarizing the conductive layer and the polymer layer to a same surface. A system for performing the method includes the substrate, the stencil and an energy source for curing the polymer layer. The system also includes an optical or mechanical alignment apparatus for aligning the stencil to the substrate.

17 Claims, 6 Drawing Sheets

U.S. PATENT DOCUMENTS

| | | | |
|---|---|---|---|
| 6,333,555 | B1 | 12/2001 | Farnworth et al. |
| 6,387,787 | B1 | 5/2002 | Mancini et al. |
| 6,482,742 | B1 | 11/2002 | Chou |
| 6,517,995 | B1 | 2/2003 | Jacobson et al. |
| 6,518,096 | B2 | 2/2003 | Chan et al. |
| 6,518,189 | B1 | 2/2003 | Chou |
| 6,521,324 | B1 | 2/2003 | Debe et al. |
| 6,716,754 | B2 | 4/2004 | Hofmann |
| 6,897,089 | B1 | 5/2005 | Farnworth |
| 2002/0000330 | A1 | 1/2002 | Kinoshita |
| 2002/0167117 | A1 | 11/2002 | Chou |
| 2003/0070569 | A1 | 4/2003 | Bulthaup et al. |

OTHER PUBLICATIONS

Information about HS 11 RTV High Strength Moldingmaking silicone Rubber Product Line, Dow Coming, pp. 1-3, 1992.

"Large scale nanolithography using nanoimprint lithography" Babak Heidar et al., J. Vac. Sci. Tech. B17(6), Nov./Dec. 1999, American Vacuum Society, pp. 2961-2964.

Website: http://www.dow.com/cyclotene/prod/prod1.htm: Cyclotene, Photosensitive Resins, May 14, 2001.

Website: http://www.dow.com/cyclotene/apps/app11.htm: Cyclotene: Bumping/Redistribution/Wafer Level Packaging) (WLP); May 14, 2001.

Website: http://www.dow.com/cyclotene/apps/app13.htm: Cyclotene: Multilayer Interconnects; May 14, 2001.

Website: http://www.dow.com/cyclotene/over.htm: Cyclotene: BCB Properties; May 14, 2001.

Website: http://www.dow.com/cyclotene/over/tg.htm. TG vs Cure, May 14, 2001.

"New Polymer Material for Nanoimprinting". H. Schultz et al., J. Vac. Sci. Technology, B18(4), Jul./Aug. 2000, pp. 1861-1865.

* cited by examiner

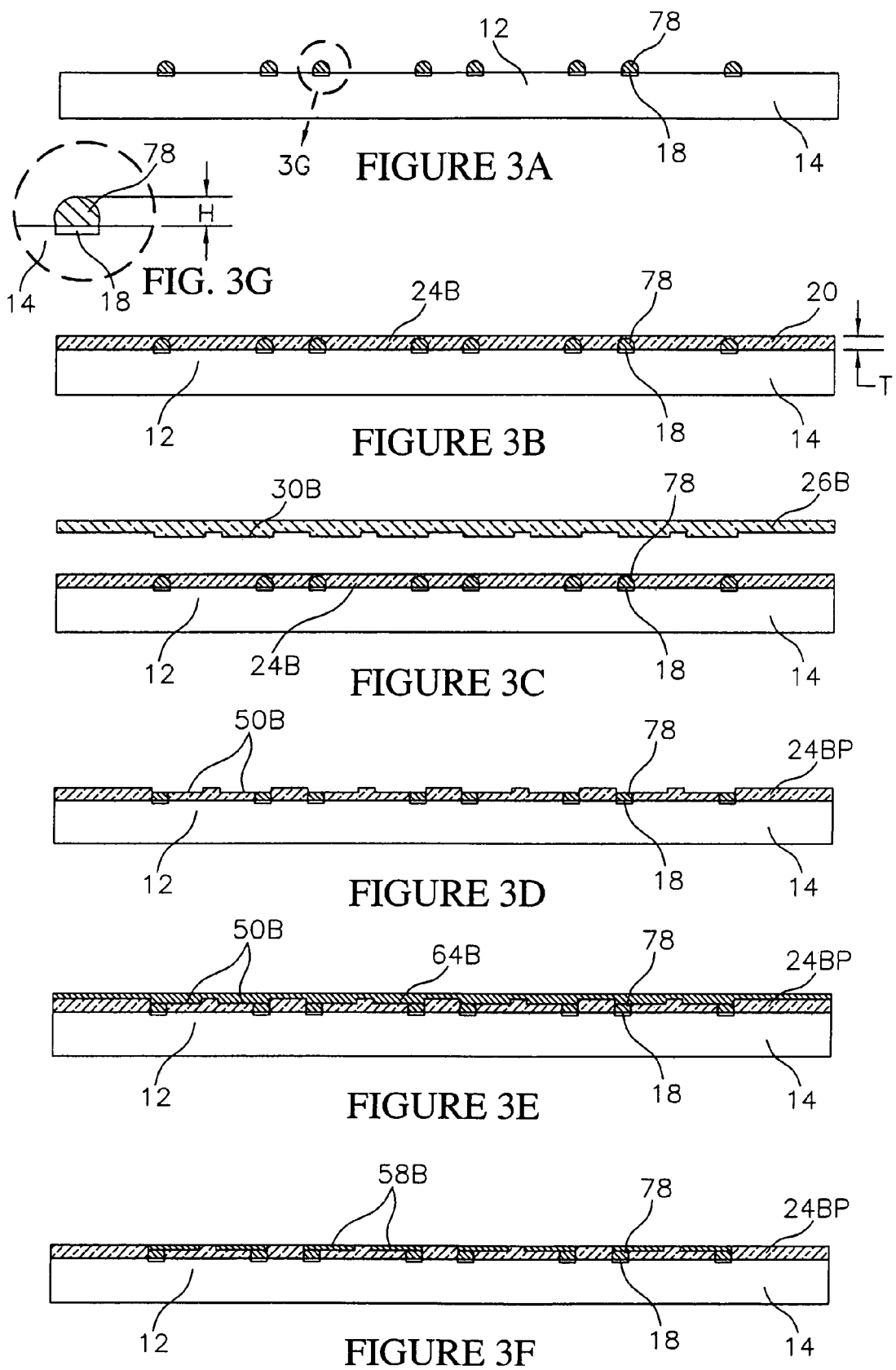

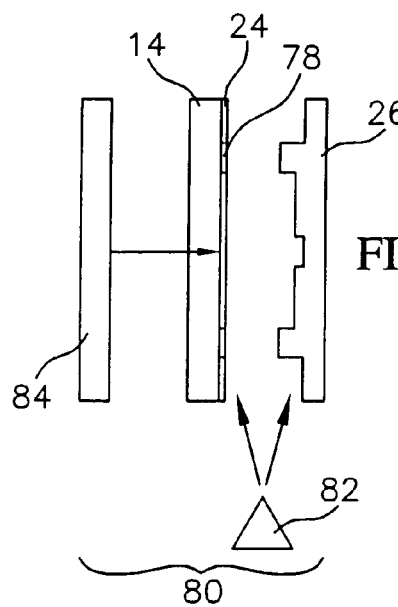
FIGURE 4
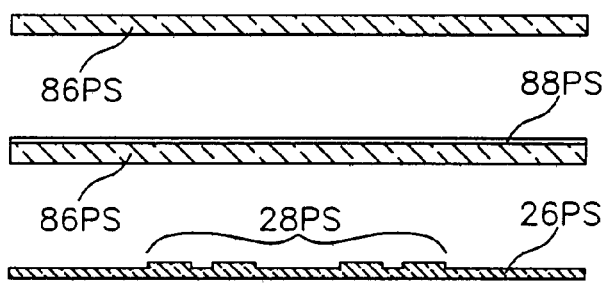
FIGURE 5A
FIGURE 5B
FIGURE 5C
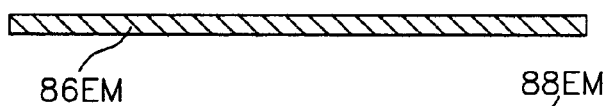
FIGURE 6A
FIGURE 6B
FIGURE 6C
FIGURE 7A
FIGURE 7B
FIGURE 7C

METHOD FOR FABRICATING A SEMICONDUCTOR COMPONENT USING CONTACT PRINTING

CROSS REFERENCE TO RELATED APPLICATIONS

This application is a continuation of Ser. No. 10/150,144 filed May 17, 2002, U.S. Pat. No. 6,897,089 Bl.

FIELD OF THE INVENTION

This invention relates generally to semiconductor manufacture and packaging. More particularly, this invention relates to a method and a system for fabricating semiconductor components, and to systems incorporating the components.

BACKGROUND OF THE INVENTION

Semiconductor components, such as chip scale packages, BGA devices, flip chip devices, and bumped dice include terminal contacts, such as contact balls, contact bumps or contact pins. The terminal contacts provide the input/output points for a component, and permit the component to be surface mounted to a supporting substrate, such as a module substrate, or a printed circuit board (PCB). Typically, the terminal contacts are arranged in a dense grid array, such as a ball grid array (BGA), or a fine ball grid array (FBGA).

A semiconductor component also includes a semiconductor die, and the terminal contacts are in electrical communication with the integrated circuits contained on the die. Oftentimes the dice are fabricated with standard bond pad configurations, and patterns of conductors formed directly on the dice provide separate electrical paths between the terminal contacts and the bond pads. These patterns of conductors are sometimes referred to as "redistribution" conductors, because the input/output configuration of the component is redistributed from the bond pads to the terminal contacts.

The redistribution conductors must be electrically insulated from other conductors on the die, and must also be encapsulated in electrically insulating layers. As the redistribution conductors and the terminal contacts become smaller and more closely spaced, improved methods for fabricating the redistribution conductors, the terminal contacts, and the electrically insulating layers are required.

In addition, it is preferable that the improved methods be performed at the wafer level wherein multiple components are fabricated on a substrate, such as a wafer or a panel, which is then singulated into individual components. The quality, reliability and cost of the component is often dependent on the wafer level fabrication method.

The present invention is directed to a novel wafer level fabrication method and system for fabricating semiconductor components, such as chip scale packages, BGA devices, flip chip devices, and bumped dice, in large volumes, at low costs, and with minimal defects.

SUMMARY OF THE INVENTION

In accordance with the present invention, a method and a system for fabricating semiconductor components using contact printing are provided.

In an illustrative embodiment of the method, semiconductor packages are fabricated on a substrate containing a plurality of semiconductor dice. Each package includes a semiconductor die, a pattern of conductors in electrical communication with the integrated circuits on the die, terminal contacts in electrical communication with the conductors, and one or more polymer layers which protect the die and electrically insulate the conductors.

The method includes the step of forming a polymer layer on the substrate, preferably in a semi-cured or B-stage condition. The method also includes the steps of providing a stencil having a plurality of patterns thereon, and forming complimentary patterns in the semi cured polymer layer using the stencil. The patterns on the stencil are defined by features, such as pillars, ridges, pockets, grooves or openings, which are adapted to form complimentary features in the polymer layer.

The method also includes the steps of curing the polymer layer, depositing a conductive layer on the complimentary patterns, and then planarizing the conductive layer to a surface of the polymer layer. Depending on the configuration and layout of the conductors and the terminal contacts, multiple polymer layers, multiple complimentary patterns and multiple conductive layers can be formed on the dice in a staged sequence. The method also includes the steps of forming terminal contacts on the conductors, and singulating the dice into a plurality of separate components.

The system includes the substrate, the stencil and an energy source for curing the polymer layer. The energy source can comprise a furnace, or in the case of a transparent stencil, a light source. The system also includes an optical or mechanical alignment apparatus for aligning the stencil to the substrate.

Also provided are methods for forming different types of stencils, such as a photosensitive stencil, an etched or stamped metal stencil, and a deposited metal stencil.

BRIEF DESCRIPTION OF THE DRAWINGS

FIGS. 3A–3F are schematic cross sectional views illustrating steps in an alternate embodiment of the method for fabricating semiconductor components;

FIG. 3G is an enlarged view taken along line 3G of FIG. 3A illustrating a conductive bump on a die contact;

FIG. 4 is a schematic diagram of a system for performing the method of the invention;

FIGS. 5A–5C are schematic cross sectional views illustrating steps in a method for fabricating a photosensitive stencil;

FIGS. 6A–6C are schematic cross sectional views illustrating steps in a method for fabricating an etched or stamped metal stencil; and FIGS. 7A–7C are schematic cross sectional views illustrating steps in a method for fabricating a deposited metal stencil.

DETAILED DESCRIPTION OF THE PREFERRED EMBODIMENTS

As used herein, the term "semiconductor component" refers to an electronic element that includes a semiconductor die. Exemplary semiconductor components include semiconductor packages, BGA devices, flip chip devices and bumped semiconductor dice.

Figure 1A:
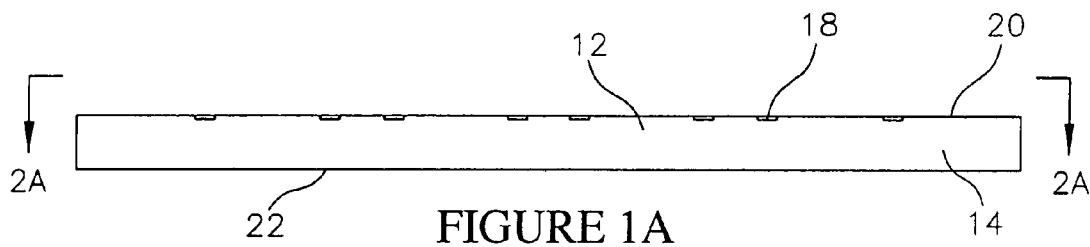
FIGS. 1A–1K are schematic cross sectional views illustrating steps in a method for fabricating semiconductor components in accordance with the invention.
Figure 1B:
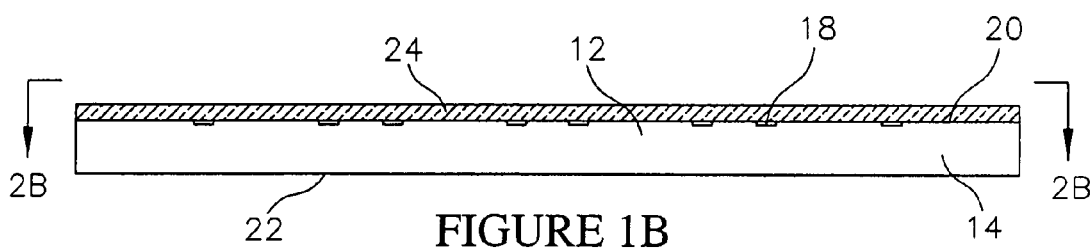
Figure 1C:
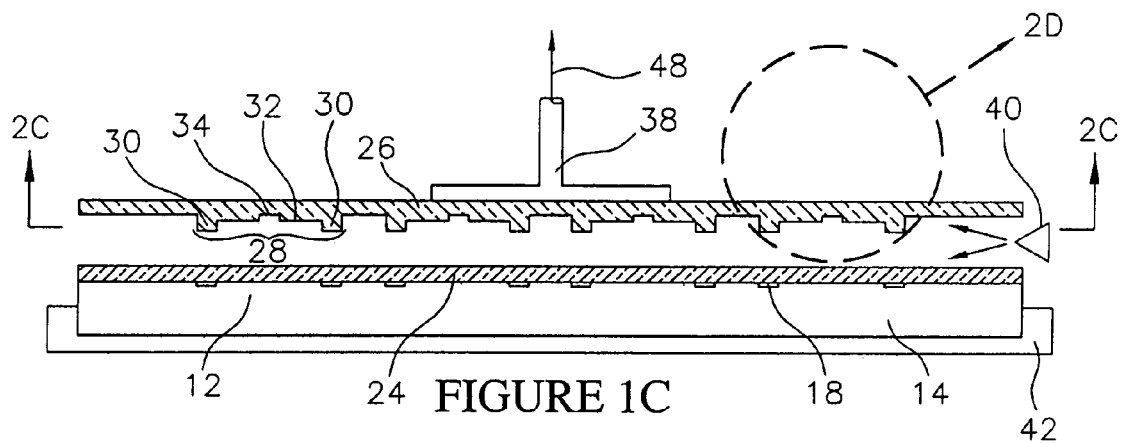
Figure 1D:
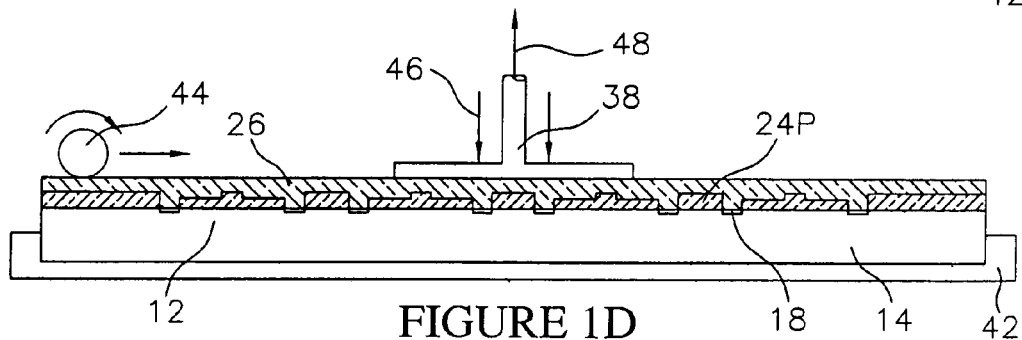
Figure 1E:
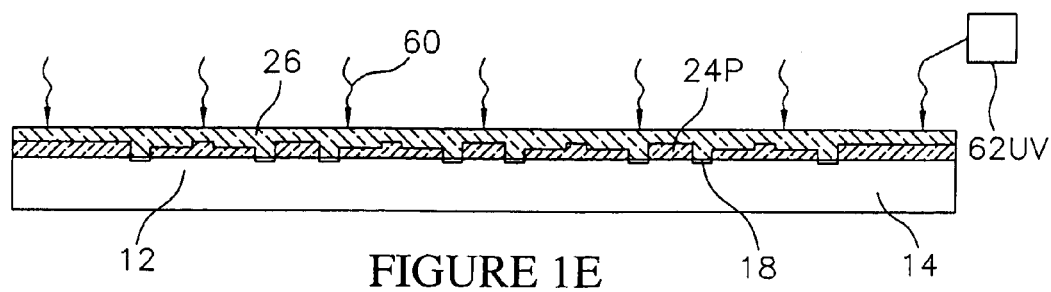
Figure 1F:
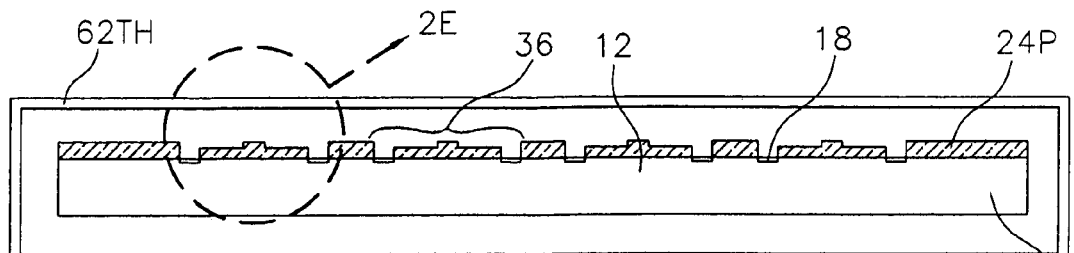
Figure 1G:
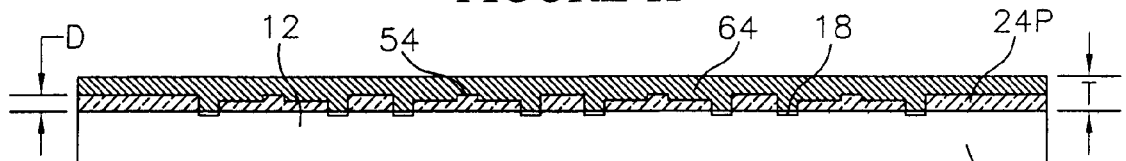
Figure 1H:
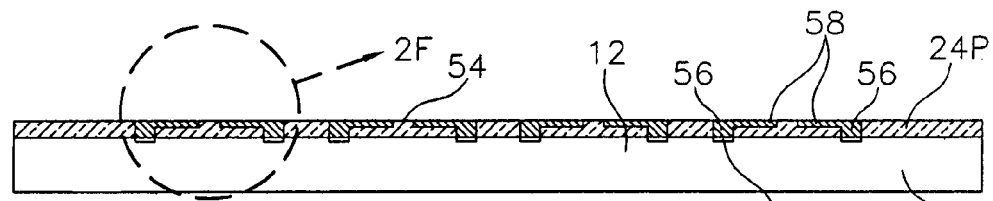
Figure 1I:
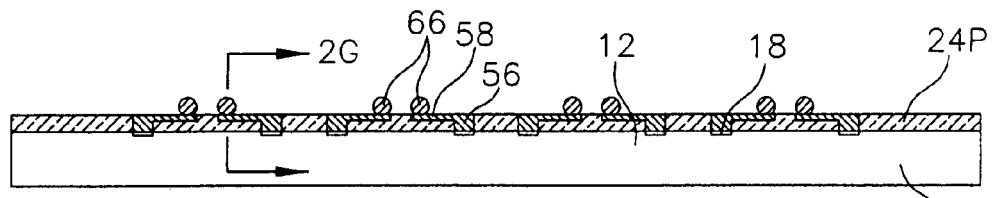
Figure 1J:
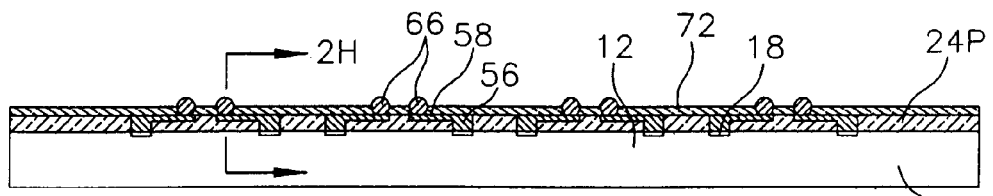
Figure 1K:
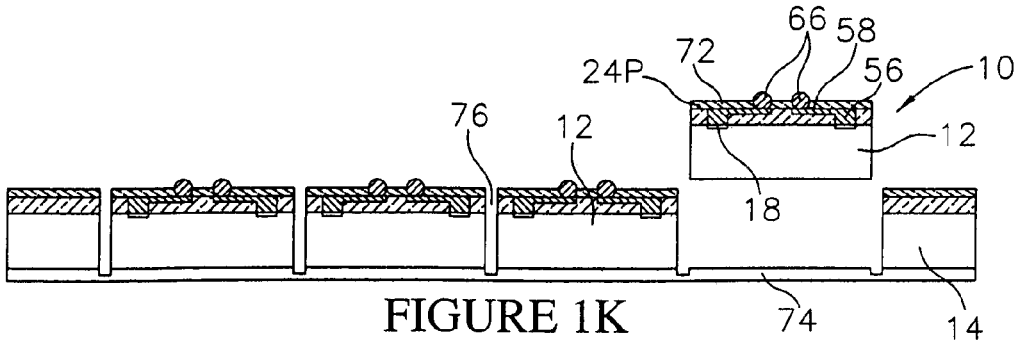
Figure 2A:
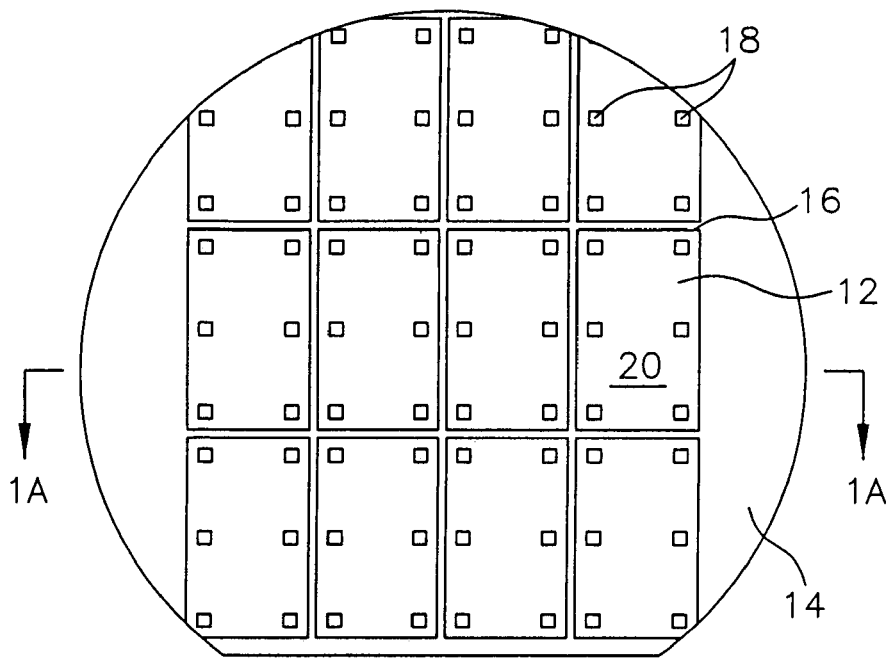
FIG. 2A is a view taken along line 2A—2A of FIG. 1A illustrating semiconductor dice on a substrate.

Referring to FIGS. 1A–1K, steps in the method for fabricating a semiconductor component 10 (FIG. 1K) in accordance with the invention are illustrated. Initially, as shown in FIGS. 1A and 2A, a plurality of semiconductor dice 12 are provided, for fabricating a plurality of semiconductor components 10 (FIG. 1K). The dice 12 can comprise conventional semiconductor dice having a desired configuration. For example, each die 12 can comprise a dynamic random access memory (DRAM), a static random access memory (SRAM), a flash memory, a microprocessor, a digital signal processor (DSP) or an application specific integrated circuit (ASIC). The dice 12 and the components 10 can have any polygonal shape. In the illustrative embodiment, the dice 12 and the components 10 are rectangular in shape, but other polygonal shapes, such as square or hexagonal can also be utilized.

As shown in FIG. 2A, the dice 12 are contained on a substrate 14. In the illustrative embodiment, the substrate 14 comprises a semiconductor wafer. However, it is to be understood that the method can be performed on a portion of a wafer, on a panel, or on any other substrate that contains multiple semiconductor dice. The dice 12 are formed on the substrate 14 with integrated circuits and semiconductor devices using techniques that are well known in the art. As also shown in FIG. 2A, the dice 12 are separated by streets 16 on the substrate 14.

As shown in FIG. 2A, each die 12 includes a pattern of die contacts 18 formed on a circuit side 20 thereof, in a dense area array, in electrical communication with the integrated circuits thereon. For example, the die contacts 18 can comprise bond pads having a desired size and spacing. In addition, the die contacts 18 can comprise a metal such as nickel, copper, gold, silver, platinum, palladium, tin, zinc and alloys of these metals. Each die 12 also includes a back side 22.

Figure 2B:
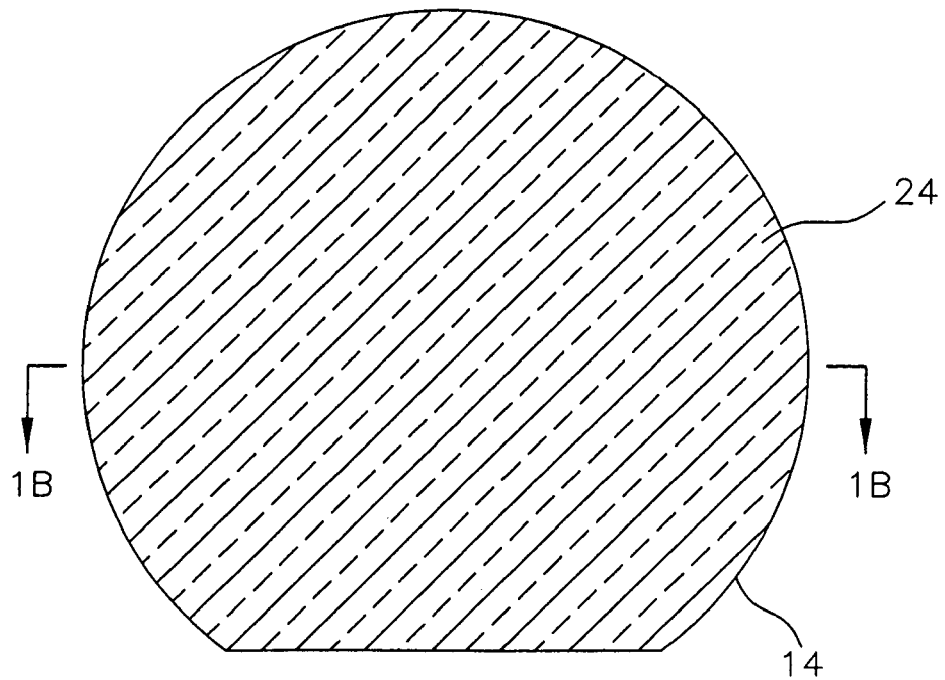
FIG. 2B is a view taken along line 2B—2B of FIG. 1B illustrating a polymer layer on the substrate.

Next, as shown in FIGS. 1B and 2B, a polymer layer 24 is formed on the circuit side 20 of the substrate 14, preferably in a semi cured or B-stage condition. For example, the polymer layer 24 can comprise a curable polymer deposited in a viscous condition to a desired thickness using a suitable deposition process such as deposition through a nozzle, screen printing, stenciling or spin coating. Suitable polymer materials for the polymer layer 24 include epoxy, silicone, natural rubber, synthetic rubber, polyimide and similar elastomeric materials. A representative thickness for the polymer layer 24 can be from about 1.0 µm to 50 µm. One suitable material dispensing system for depositing the polymer layer 24 is manufactured by Asymtek of Carlsbad, Calif.

Following deposition onto the substrate 14, the polymer layer 24 can be placed in a semi cured, or B-stage condition, using a suitable process, such as by heating to a required temperature, and for a required time period to outgas a solvent. An exemplary heating procedure for semi curing the polymer layer 24 can be heating to a temperature of about 25° C. to 80° C. for a time period of about 60 minutes to 120 minutes. As will be further described, the polymer layer 24 can also be placed in a semi cured, or B-stage condition, using an energy source such as UV light.

As used herein, the term semi cured, or B-stage condition, means the polymer layer 24 is soft and impressionable, but still possesses no flow characteristics, and a structural rigidity sufficient to maintain features of a stamped pattern. By way of example, a representative durometer for the polymer layer 24 in the semi cured or B-stage condition, can be from about 20–40 on the shore A scale.

The polymer layer 24 can also comprise a curable photoimageable polymer, such as a thick film resist. One suitable thick film resist is sold by Shell Chemical under the trademark "EPON RESIN SU-8". The resist also includes an epoxy base, an organic solvent (e.g., gamma-butyloracton), and may include a photoinitiator. The resist can be deposited to a thickness of from about 0.3–50 mils.

Figure 2C:
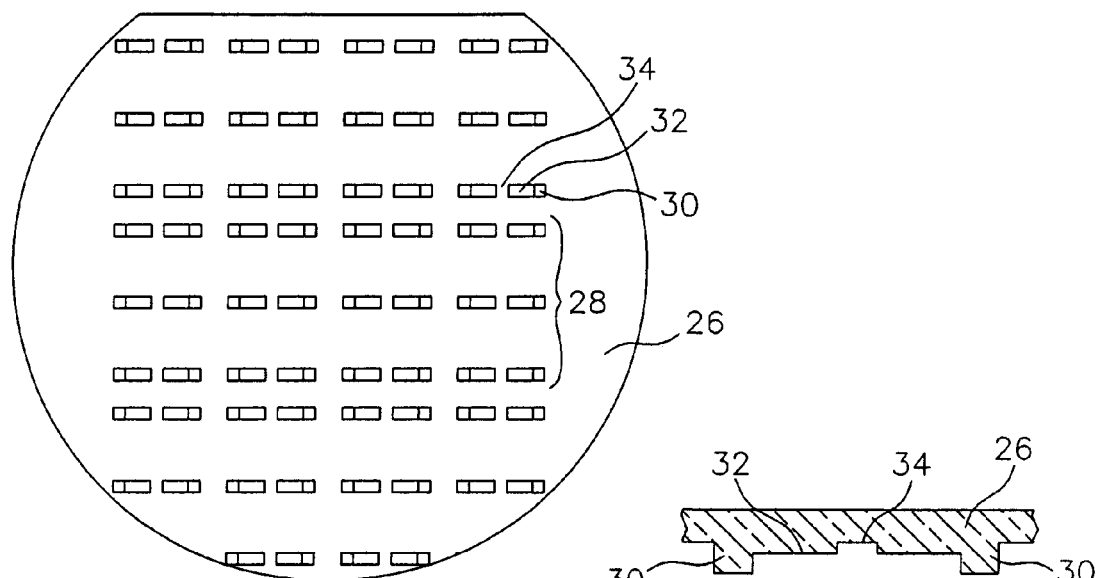
FIG. 2C is a view taken along line 2C—2C of FIG. 1C illustrating a stencil for contact printing the polymer layer.
Figure 2D:
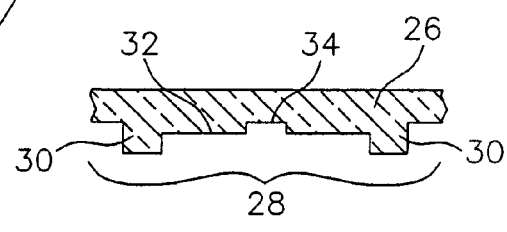
FIG. 2D is an enlarged view taken along line 2D of FIG. 1C illustrating a pattern on the stencil.

Next, as shown in FIG. 1C, a stencil 26 is provided. As shown in FIGS. 2C and 2D, the stencil 26 includes a plurality of patterns 28 which include features 30, 32, 34. As shown in FIG. 2D the features 30 can comprise pillars, ridges, bumps or mounds having surfaces that are raised with respect to other surfaces on the stencil 26. The features 32 can comprise grooves, pockets or slots in contact with the features 30. The features 34 can comprise grooves, pockets or slots in contact with the features 32.

Each of the patterns 28 is adapted to imprint a complimentary pattern 36 (FIG. 2E) in the polymer layer 24, with each die 12 including at least one complimentary pattern 36. The stencil 26 can comprise a metal plate, or a photosensitive glass plate having the patterns 28 formed thereon. As will be further explained, a metal plate can be etched to form the features 30, 32, 34 which define the patterns 28. Alternately, a metal plate can include deposited layers which form the features 30, 32, 34 which define the patterns 28. A photo sensitive glass plate can be photopatterned and developed to form the features 30, 32, 34 which define the patterns 28.

As also shown in FIG. 1C, an alignment step is performed in which the stencil 26 is aligned with the substrate 14, such that the patterns 28 align with the dice 12. Alignment can be accomplished using optical alignment or stage condition, can be from about 20–40 on the shore A scale.

The polymer layer 24 can also comprise a curable photoimageable polymer, such as a thick film resist. One suitable thick film resist is sold by Shell Chemical under the trademark "EPON RESIN SU-8". The resist also includes an epoxy base, an organic solvent (e.g., gamma-butyloracton), and may include a photoinitiator. The resist can be deposited to a thickness of from about 0.3–50 mils.

Next, as shown in FIG. 1C, a stencil 26 is provided. As shown in FIGS. 2C and 2D, the stencil 26 includes a plurality of patterns 28 which include features 30, 32, 34. As shown in FIG. 2D the features 30 can comprise pillars, ridges, bumps or mounds having surfaces that are raised with respect to other surfaces on the stencil 26. The features 32 can comprise grooves, pockets or slots in contact with the features 30. The features 34 can comprise grooves, pockets or slots in contact with the features 32.

Each of the patterns 28 is adapted to imprint a complimentary pattern 36 (FIG. 2E) in the polymer layer 24, with each die 12 including at least one complimentary pattern 36. The stencil 26 can comprise a metal plate, or a photosensitive glass plate having the patterns 28 formed thereon. As will be further explained, a metal plate can be etched to form the features 30, 32, 34 which define the patterns 28. Alternately, a metal plate can include deposited layers which form the features 30, 32, 34 which define the patterns 28. A photo sensitive glass plate can be photopatterned and developed to form the features 30, 32, 34 which define the patterns 28.

As also shown in FIG. 1C, an alignment step is performed in which the stencil 26 is aligned with the substrate 14, such that the patterns 28 align with the dice 12. Alignment can be accomplished using optical alignment or mechanical alignment. For example, with optical alignment a vacuum tool 38 can be used to hold the stencil 26 as indicated by vacuum arrow 48, and to move the stencil 26 in X, Y and Z directions, while the substrate 14 is held in a holder 42. In addition, an optical viewing device 40 can be used to view the features 30, 32, 34 on the stencil 26. The optical viewing device 40 can also view features on the substrate 14, such as the die contacts 18, provided the polymer layer 24 is transparent.

As another alternative the substrate 14 can include alignment features such as alignment fiducials, that are not covered by the polymer layer 24, and the stencil 26 can include corresponding alignment features. Optical alignment techniques and equipment are further described in U.S. Pat. No. 5,634,267 to Farnworth et al., entitled "Method And Apparatus For Manufacturing Known Good Semiconductor Die", which is incorporated herein by reference.

Alternately, alignment can be accomplished using a mechanical alignment system. For example, an alignment fixture can be associated with the holder 42 to mechanically align the stencil 26 to the substrate 14. Various mechanical alignment systems are described in U.S. Pat. No. 6,285,203B1 to Akram et al., entitled "Test System Having Alignment Member For Aligning Semiconductor Components", which is incorporated herein by reference.

Figure 2E:
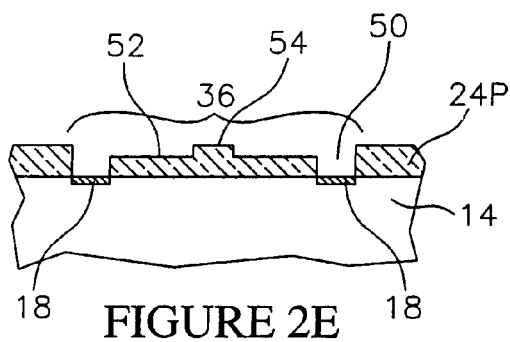
FIG. 2E is an enlarged view taken along line 2E of FIG. 1F illustrating a complimentary pattern on the polymer layer.

Next, as shown in FIG. 1D, a contact printing step is performed in which the stencil 26 is placed in contact with the polymer layer 24 to form a patterned polymer layer 24P imprinted with the complimentary patterns 36 (FIG. 2E). The vacuum tool 38 can be used to push the stencil 26 into the polymer layer 24P as indicated by force arrows 46. In addition, one or more mechanical rollers 44 can be rolled over the stencil 26 to push the features 30, 32, 34 into the polymer layer 24. Preferably the polymer layer 24 is in a semi cured or B-stage condition during the contact printing step such that imprinting of the complimentary patterns 36 (FIG. 2E) is facilitated.

As shown in FIG. 2E, the complimentary patterns 36 in the patterned polymer layer 24P include recessed features 50 that are recessed with respect to a surface 54 of the patterned polymer layer 24P. The recessed features 50 are formed by the features 30 (FIG. 2D) on the stencil 26. The recessed features 50 can comprise openings, pockets, or grooves that at least partially align with the die contacts 18. The recessed features 50 will be used to form conductive vias 56 (FIG. 2F) in electrical communication with the die contacts 18.

The complimentary patterns 36 also include recessed features 52 that are recessed with respect to the surface 54 of the patterned polymer layer 24P. The recessed features 52 are formed by the features 32 on the stencil 26. The recessed features 52 will be used to form conductors 58 (FIG. 2F) in electrical communication with the conductive vias 56 (FIG. 2F) and the die contacts 18. In the illustrative embodiment, the conductors 58 comprise redistribution conductors that redistribute the pattern of the die contacts 18.

Following the contact printing step, a curing step is performed. As shown in FIG. 1E, the curing step can be performed by transmitting light 60, such as UV light, through the stencil 26. In this case, the stencil 26 can comprise a light transparent material, such as photo transmittive glass. By way of example, light curing can be performed using a light energy source 62UV, such as a conventional UV mask writer and a selected dose of UV light, such as about 165 mJ/cm$^2$. In addition, light curing can be accomplished while the stencil 26 remains in contact with the patterned polymer layer 24P.

Alternately as shown in FIG. 1F, the curing step can be performed using a thermal energy source 62TH, such as a furnace. In this case the substrate 14 can be held in the thermal energy source 62TH at a temperature and for a time period sufficient to cure the patterned polymer layer 24P. The temperature and time period will depend on the polymer, with a temperature of about 100° C.–200° C., and a time period of several minutes to an hour or more being representative. With thermal curing the stencil 26 can be pulled away from the patterned polymer layer 24P, as shown in FIG. 1F, or alternately can remain in contact with the patterned polymer layer 24P as shown in FIG. 1E.

Next, as shown in FIG. 1G, a an electrically conductive layer 64 is formed on the patterned polymer layer 24P, and on the complimentary patterns 36 in the patterned polymer layer 24P. This step can be performed using a suitable plating or deposition process, such as electrolytic deposition, electroless deposition, chemical vapor deposition or sputtering. In addition, a thickness T of the conductive layer 64 measured from the circuit side 20 of the substrate 14, is preferably greater than a depth D of the recessed features 50 measured from the surface 54 of the patterned polymer layer 24P. Preferably the conductive layer 64 comprises a highly conductive metal such as such as aluminum, titanium, nickel, iridium, copper, gold, tungsten, silver, platinum, palladium, tantalum, molybdenum, tin, zinc and alloys of these metals.

Figure 2F:
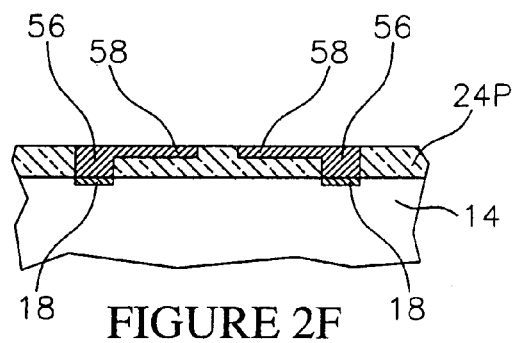
FIG. 2F is an enlarged view taken along line 2F of FIG. 1H illustrating conductors on the substrate.

Next, as shown in FIG. 1H, a planarization step is performed in which the conductive layer 64 is planarized to the surface 54 of the patterned polymer layer 24P. As shown in FIG. 2F, the planarization step forms the conductive vias 56 and the conductors 58 in the patterned polymer layer 24P. The planarization step can planarize both the conductive layer 64 and the patterned polymer layer 24P, or can be end pointed at the original surface 54 of the patterned polymer layer 24P.

The planarization step can be performed using a mechanical planarization apparatus (e.g., a grinder). One suitable mechanical planarization apparatus is manufactured by Okamoto, and is designated a model no. VG502. The planarization step can also be performed using a chemical mechanical planarization (CMP) apparatus. Suitable CMP apparatus are commercially available from manufacturers such as Westech, SEZ, Plasma Polishing Systems, or TRUSI. The planarization step can also be performed using an etch back process, such as a wet etch process, a dry etch process or a plasma etching process.

The contact printing, curing, conductive layer deposition, and planarization steps can be repeated as required to make multi layered structures and interlevel conductors.

Figure 2G:
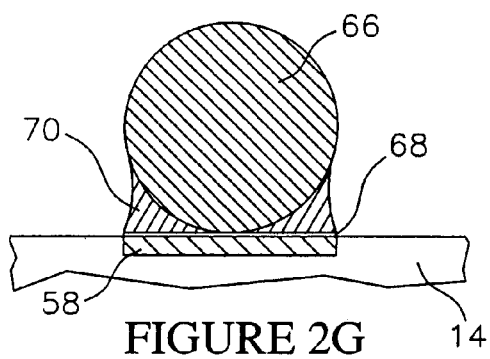
FIG. 2G is an enlarged cross sectional view taken along line 2G—2G of FIG. 1I illustrating a terminal contact bonded to a conductor.

Next, as shown in FIGS. 1I and 2G a terminal contact forming step is performed for forming terminal contacts 66. This step can be performed by forming bonding pads 68 on, or in electrical communication with the conductors 58, and then bonding, or depositing, the terminal contacts 66 on the bonding pads 68. For example, the terminal contacts 66 can comprise metal balls bonded to the bonding pads 68 using solder fillets 70 formed using a solder reflow or other suitable process. Alternately, the terminal contacts 66 can comprise bumps deposited on the bonding pads 68 using a deposition process, such as stenciling and reflow of a solder alloy.

The terminal contacts 66 can also be formed by electrolytic deposition, by electroless deposition, or by ball bumping. A suitable ball bumper is manufactured by Pac Tech Packaging Technologies of Falkensee, Germany. The terminal contacts 66 can also be formed using a conventional wire bonder apparatus adapted to form a ball bond, and then to sever the attached wire.

In addition, the number, the diameter and the pitch of the terminal contacts 66 can be selected as required. A representative diameter can be from about 0.005-in (0.127 mm) to about 0.016-in (0.400 mm) or larger. A representative pitch can be from about 0.004-in (0.100 mm) to about 0.039-in (1.0) mm or more.

Figure 2H:
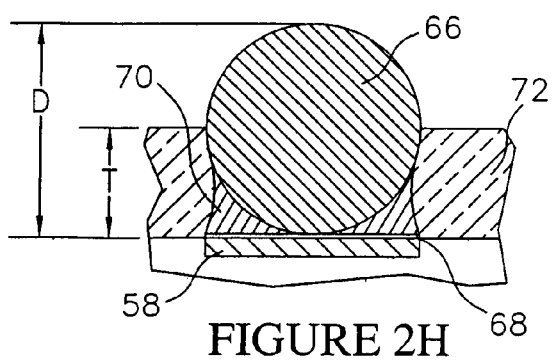
FIG. 2H is an enlarged cross sectional view taken along line 2H—2H of FIG. 1J illustrating the terminal contact and a rigidifying polymer layer.

Optionally, as shown in FIG. 1J, the terminal contacts 66 can be rigidified with a polymer support layer 72, as described in U.S. Pat. No. 6,180,504 B1 to Farnworth et al., which is incorporated herein by reference. As shown in FIG. 2H, the polymer support layer 72 has a thickness T that is less than the diameter D of the terminal contacts 66.

As shown in FIG. 1K, following formation of the terminal contacts 66, a singulating step can be performed to singulate the components 10 from the substrate 14 and from one another. During the singulating step, a dicing tape 74 is attached to the substrate 14 and grooves 76 are sawn, or otherwise formed in the substrate 14 in the streets between the dice 12.

Each singulated component 10 includes a semiconductor die 12 and a portion of the patterned polymer layer 24P formed on the circuit side of the die 12. Each singulated component 10 also includes the conductive vias 56 in electrical communication with the die contacts 18, and the conductors 56 in electrical communication with the conductive vias 56. In addition, each singulated component includes the terminal contacts 66 on the conductors 58, and optionally the polymer support layer 72.

Referring to FIGS. 3A–3F, an alternate embodiment of the method of the invention is illustrated. As shown in FIG. 3A, a substrate 14 containing a plurality of semiconductor dice 12 is provided. The dice 12 include die contacts 18 in electrical communication with the integrated circuits formed thereon, substantially as previously described. However, in this embodiment the die contacts 18 include conductive bumps 78 such as would occur on a "bumped" semiconductor wafer used for fabricating "flip chip" dice or C4 dice. As shown in FIG. 3G, the conductive bumps 78 can comprise metal bumps (or balls) formed using a suitable deposition or bonding process, substantially as previously described for the terminal contacts 66 (FIG. 1I). Also, rather than being a metal, the conductive bumps 78 can comprise a conductive polymer material.

Next, as shown in FIG. 3B, a polymer layer 24B is formed on the substrate 14 substantially as previously described. The polymer layer 24B has a thickness T that is greater than a height H (FIG. 3G) of the bumps 78.

Next, as shown in FIG. 3C, a stencil 26B is provided. The stencil 26B includes features 30B which are similar to the features 30 previously described for stencil 26. The features 30B are adapted to form conductors 58B in electrical communication with the bumps 78.

Next, as shown in FIG. 3D, the stencil 26B is used to form recessed features 50B in a patterned polymer layer 24BP. In this case, the bumps 78 provide an end point for the stencil 26B, such that the surfaces of the features 30B on the stencil 26B contact the bumps 78. The bumps 78 also simplify alignment because the conductive vias 56 (FIG. 1H) are not required. In addition, some misalignment of the stencil 26B can occur, as long as portions of features 30B on the stencil 26B align with portions of the bumps 78.

Next, as shown in FIG. 3E, a conductive layer 64B is formed on the patterned polymer layer 24BP and in the recessed features 50B, substantially as previously described.

Next, as shown in FIG. 3F, the conductive layer 64B is planarized to form conductors 58B in electrical communication with the bumps 78. Next, a terminal contact forming step and a singulating step can be performed, substantially as previously described and shown in FIGS. 1I–1K.

Referring to FIG. 4, a system 80 for performing the method of the invention is illustrated in schematic form. The system 80 includes the substrate 14, and the polymer layer 24 on the substrate 14. The system 80 can also include the bumps 78 on the substrate 14. In addition, the system 80 includes the stencil 26, and an optical or mechanical alignment apparatus 82 for aligning the stencil 26 with the substrate 14. The system 80 also includes an energy source 84 for curing the polymer layer 24. The system 80 can also include the vacuum tool 38 (FIG. 1C), the holder 42 (FIG. 1C) and the roller 44 (FIG. 1D).

Referring to FIGS. 5A–5C, steps in a method for fabricating a photosensitive stencil 26PS (FIG. 5C) are illustrated. Initially, as shown in FIG. 5A, a photosensitive substrate 86PS is provided. The photosensitive substrate 86PS can comprise a plate made of a photosensitive glass, such as a product manufactured by Corning under the trademark "FOTOFORM". In addition, the photosensitive substrate 86PS can have a peripheral outline that substantially matches, or is slightly larger than a peripheral outline of the substrate 14 (FIG. 1A). A representative thickness of the photosensitive substrate 86PS can be from about 2 mm to 4 mm.

Next, as shown in FIG. 5B, a mask 88PS having a plurality of desired patterns 28PS (FIG. 5C) is formed on the photosensitive substrate 86PS. The mask 88PS can comprise a photoimageable polymer, such as photoresist, that is patterned and developed with openings corresponding to the patterns 28PS (FIG. 5C). The photosensitive substrate 86PS is then exposed through the mask 88PS using a radiation source, such as collimated UV light, to form latent images in the photosensitive substrate 86PS which correspond to the patterns 28PS (FIG. 5C). The mask 88PS is then stripped using a suitable stripper. The latent images are then developed by heating the photosensitive substrate 86PS to a selected temperature (e.g., 500° C. to 600° C.). Following development of the latent images, clear areas of the photosensitive substrate 86PS can also be exposed using uncollimated UV light.

Next, as shown in FIG. 5C, the photosensitive substrate 86PS is etched to form the patterns 28PS from the developed latent images. Etching can be accomplished using a suitable etchant, such as HF acid, that etches the latent images. The completed photosensitive stencil 26PS can be transparent, such that a UV curing step for the polymer layer 24 (FIG. 1B) can be performed as shown in FIG. 1E. In addition, the completed photosensitive stencil 26PS has a thermal coefficient of expansion (TCE) which is close to that of a substrate 14 made of silicon (e.g., a silicon wafer). This allows thermal curing to be performed with the photosensitive stencil 26PS in contact with the substrate 14, with reduced thermal stress developing between the photosensitive stencil 26PS and the substrate 14.

Referring to FIGS. 6A–6C, steps in a method for fabricating an etched or stamped metal stencil 26EM (FIG. 6C) are illustrated. The etched or stamped metal stencil 26EM is similar in construction to an etched or stamped metal leadframe used for fabricating semiconductor packages. Initially, as shown in FIG. 6A, a metal substrate 86EM is provided. The metal substrate 86EM can comprise a plate made of an etchable or stampable metal, such as a copper alloy, or a nickel alloy. A representative thickness of the metal substrate 86EM can be from about 0.20 mm to 0.50 mm.

Next, as shown in FIG. 6B, a mask 88EM having a plurality of desired patterns 28EM (FIG. 6C) is formed on the metal substrate 86EM. The mask 88EM can comprise a photoimageable polymer, such as photoresist, that is patterned and developed with openings corresponding to the patterns 28EM (FIG. 6C).

Next, as shown in FIG. 6C, the metal substrate 86EM is etched using the mask 88EM with patterns of openings 90EM that define the patterns 28EM. The mask 88EM is then stripped using a suitable stripper. The openings 90EM can extend completely through the thickness of the metal substrate 86EM as shown, or alternately only part way through the thickness of the metal substrate 86EM. One advantage of through openings 90EM is that the polymer layer 24 can flow through the openings 90EM during a contact printing step (FIG. 1D) performed using the stencil 26EM.

Alternately, rather than being formed with an etching process, the patterns 28EM can be formed by stamping the metal substrate 86EM, such as with progressive dies. Such a stamping technique is widely used in semiconductor manufacture for fabricating metal leadframes.

Referring to FIGS. 7A–7C, steps in a method for fabricating a deposited metal stencil 26DM (FIG. 7C) are illustrated. Initially, as shown in FIG. 7A, a metal substrate 86DM is provided. The metal substrate 86DM can comprise a plate made of a suitable metal, such as steel, copper, nickel or alloys of these metals. A representative thickness of the metal substrate 86DM can be from about 0.20 mm to 0.50 mm.

Next, as shown in FIG. 7B, a mask 88DM having a plurality of desired patterns 28DM (FIG. 7C) is formed on the metal substrate 86DM. The mask 88DM can comprise a photoimageable polymer, such as photoresist, that is patterned and developed with openings corresponding to the patterns 28DM (FIG. 7C).

Next, as shown in FIG. 7C, metal layers 92DM are deposited through the openings in the mask 88DM to define the patterns 28DM. The metal layers 92DM can be deposited using a suitable deposition process such as chemical vapor deposition, sputtering, electrolytic deposition, electroless deposition, screen printing or stenciling. Following the deposition process for the metal layers 92DM, the mask 88DM can be stripped using a suitable stripper.

Thus the invention provides a method and a system for fabricating semiconductor components using contact printing. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
    providing a semiconductor die having a polymer layer thereon and a die contact comprising a bump in the polymer layer;
    providing a stencil having a pattern thereon;
    pressing the stencil into the polymer layer using the bump as an endpoint to form a complimentary pattern in the polymer layer; and
    forming a conductive layer on the complimentary pattern.

2. The method of claim 1 further comprising planarizing the conductive layer to a surface of the polymer layer.

3. The method of claim 1 wherein the conductive layer comprises a conductor in electrical communication with the bump.

4. The method of claim 1 wherein the providing the stencil step comprises patterning, etching or stamping a plate with the pattern.

5. The method of claim 1 wherein the providing the stencil step comprises depositing a metal layer on a plate.

6. The method of claim 1 wherein the die is contained on a semiconductor wafer having a plurality of dice, and the pressing step and the forming step are performed on all of the dice on the wafer.

7. A method for fabricating a semiconductor component comprising:
    providing a semiconductor die having a polymer layer thereon;
    providing a light transparent stencil having a pattern thereon;
    pressing the stencil into the polymer layer to form a complimentary pattern in the polymer layer;
    curing the polymer layer by transmitting light through the stencil; and
    forming a conductive layer on the complimentary pattern.

8. The method of claim 7 wherein the stencil comprises a glass.

9. The method of claim 7 wherein the stencil comprises a photosensitive glass.

10. The method of claim 7 wherein the providing the light transparent stencil step comprises patterning a photosensitive glass with the pattern.

11. The method of claim 7 wherein the die is contained on a semiconductor wafer having a plurality of dice, and the pressing step, the curing step and the forming step are performed on the dice on the wafer.

12. A method for fabricating a semiconductor component comprising:
    providing a semiconductor die having a plurality of die contacts comprising bumps;
    forming a polymer layer on the die and the bumps;
    pressing a stencil having a plurality of features into the polymer layer into contact with the bumps to form a plurality of recessed features in the polymer layer at least partially aligned with the die contacts; and
    forming a plurality of conductors in the recessed features in electrical communication with the bumps.

13. The method of claim 12 wherein the bumps comprise a metal or a conductive polymer.

14. The method of claim 12 wherein the forming the conductors step comprises depositing a conductive material in the recessed features and planarizing the conductive material to a surface of the polymer layer.

15. The method of claim 12 further comprising forming a terminal contacts on the die in electrical communication with the conductors.

16. The method of claim 12 wherein the polymer layer is in a semi cured condition during the pressing step.

17. The method of claim 12 wherein the die is contained on a semiconductor wafer having a plurality of dice, the forming the polymer layer step, the pressing step, and the forming the conductors step are performed on the dice on the wafer.

* * * * *

UNITED STATES PATENT AND TRADEMARK OFFICE
CERTIFICATE OF CORRECTION

PATENT NO. : 6,969,681 B2 Page 1 of 1
DATED : November 29, 2005
INVENTOR(S) : Warren M. Farnworth It is certified that error appears in the above-identified patent and that said Letters Patent is hereby corrected as shown below:

Column 10,
Line 57, before "terminal" add -- plurality of --.

Signed and Sealed this

Twenty-fourth Day of January, 2006

JON W. DUDAS
*Director of the United States Patent and Trademark Office*